United States Patent
Chandhok et al.

(10) Patent No.: US 7,135,419 B2
(45) Date of Patent: Nov. 14, 2006

(54) LINE EDGE ROUGHNESS REDUCTION

(75) Inventors: Manish Chandhok, Portland, OR (US); Robert P. Meagley, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 10/245,760

(22) Filed: Sep. 16, 2002

(65) Prior Publication Data
US 2004/0053511 A1    Mar. 18, 2004

(51) Int. Cl.
*H01L 21/31*   (2006.01)
*H01L 21/469*  (2006.01)

(52) U.S. Cl. .............. 438/780; 438/725; 257/E21.024

(58) Field of Classification Search ........... 438/780, 438/781, 725, 782; 257/E21.024, E21.026
See application file for complete search history.

(56) References Cited

U.S. PATENT DOCUMENTS

| | | | |
|---|---|---|---|
| 5,858,620 A * | 1/1999 | Ishibashi et al. | 430/313 |
| 6,057,084 A * | 5/2000 | Mohondro | 430/330 |
| 2002/0058425 A1 * | 5/2002 | Richter et al. | 438/780 |
| 2002/0168594 A1 * | 11/2002 | Lin et al. | 430/324 |

* cited by examiner

*Primary Examiner*—Caridad Everhart
(74) *Attorney, Agent, or Firm*—George Chen

(57) ABSTRACT

A base-loaded polymer is applied to a semiconductor feature formed after exposing and developing a photoresist layer in order to reduce line edge roughness caused by a residual acid collecting on the edges of the feature during the post-exposure bake of the photoresist. Alternatively, a polymer is applied containing grains that are of suitable for smoothing the line edge roughness.

22 Claims, 2 Drawing Sheets

LINE EDGE ROUGHNESS REDUCTION

FIELD

Embodiments of the invention relate to the field of semiconductor manufacturing. More particularly, embodiments of the invention relate to the reduction of line edge roughness in features formed in a semiconductor device from exposure and development of photoresist within the features.

BACKGROUND

As feature sizes continue to decrease in modern photolithographic semiconductor manufacturing processes effects, such as undesired line edge roughness, insufficient lithographical resolution, and limited depth of focus problems, may increase. Specifically, photoresist image footprints typically become increasingly difficult to control as semiconductor device features become smaller and closer together, because these undesired effects seldom scale with the reduced feature size. More specifically, the molecular size in the polymer backbone used in the photoresist must typically meet certain physical/mechanical requirements and, therefore, should not be scaled with the reduction in feature size.

Line edge roughness is typically at least partially caused by acid diffusion that results when a photoresist is exposed to an incident radiation, such as ultra-violet light. The acid typically serves as a catalyst for chemical reactions (deprotection) that occur within the photoresist at high temperatures, such as a post-exposure bake. The acid may be produced by photoacid generator molecules that are blended into the photoresist and diffuse the acid upon exposure to incident radiation.

FIG. 1 is a photograph illustrating the effects of line edge roughness in a semiconductor device feature. Note that the line edge roughness results in a non-uniform feature line edge, thus limiting the feature size of the device.

Prior art methods for controlling line edge roughness include adding a base quencher to the photoresist that has a relatively low base concentration with respect to the acid concentration. Acid concentrations less than or equal to the base concentration would be quenched (neutralized) by the base.

During a post-exposure bake, at least some of the acid diffusion at a feature line edge formed by the exposed and developed photoresist would be neutralized by the base. This results in a better-defined feature edge and reduced line edge roughness. Using a base quencher prior to exposing and developing the photoresist, however, can result in a decrease in photoresist sensitivity, thereby increasing the incident radiation energy necessary to produce the same result.

BRIEF DESCRIPTION OF THE DRAWINGS

Embodiments and the invention are illustrated by way of example and not limitation in the figures of the accompanying drawings, in which like references indicate similar elements in which.

DETAILED DESCRIPTION

Embodiments of the invention described herein are intended to help reduce semiconductor process effects, such as undesired line edge roughness, insufficient lithographical resolution, and limited depth of focus problems associated with the removal of a photoresist layer from a semiconductor device feature. More particularly, embodiments of the invention relate to reducing line edge roughness in a semiconductor device by applying a base-loaded polymer to the feature after the photoresist layer has been exposed and developed.

For one embodiment of the invention, the feature line edge roughness is reduced by applying a base-loaded polymer to a semiconductor wafer using a spin process after a feature-defining photoresist layer has been exposed and removed (developed). The base-loaded polymer may be applied before a post-exposure bake ("PEB") process step or afterward. Furthermore, the polymer may be applied after a short PEB or one that is performed at a lower temperature than normal such that the photoresist is partially unprotected ("deprotection") before the polymer is applied.

Deprotection is a process wherein regions of the photoresist where acid formed by exposure to light serves as a catalyst for a chemical reaction typically during PEB, thereby removing protection groups attached to the polymer and renders them soluble in a developer.

Figure 1:
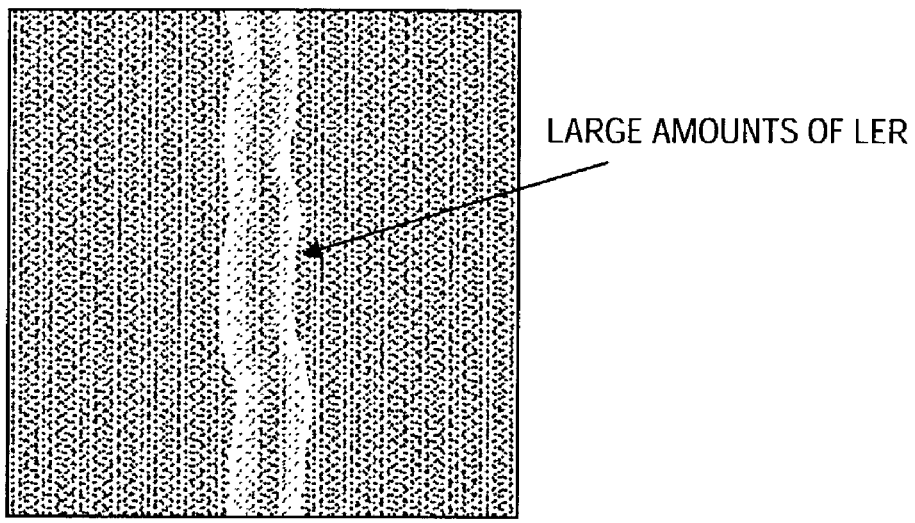
FIG. 1 is a photograph illustrating the effects of line edge roughness in a semiconductor device feature.
Figure 2:
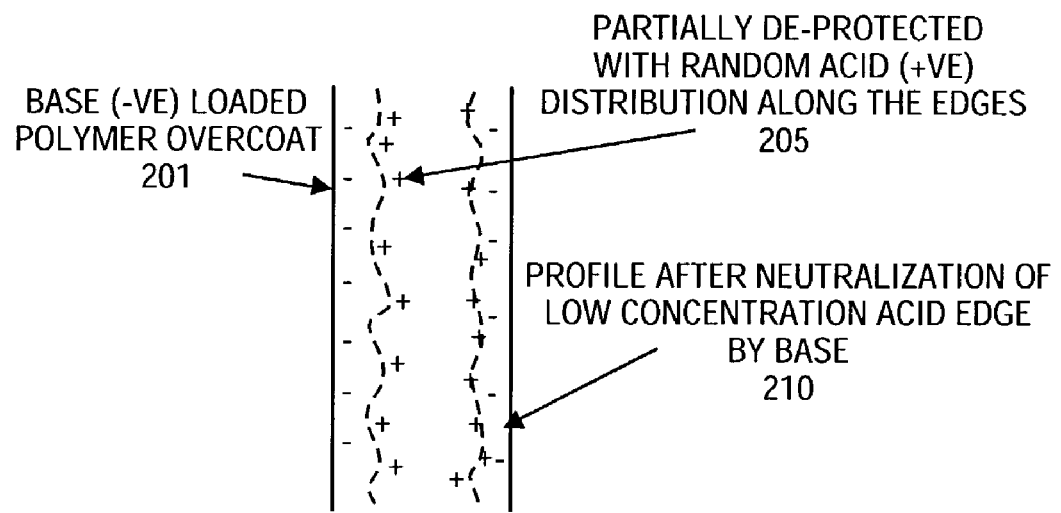
FIG. 2 illustrates a cross-section of line edge roughness according to one embodiment of the invention.

FIG. 2 illustrates an embodiment of the invention. After the PEB and/or develop process step, a conformal coating of base-loaded polymer 201 may be applied to the semiconductor wafer and baked. During this second bake, the residual acid 205, diffuses out of the feature and reacts with the base. At least some of the low acid concentration at the edge of the feature is neutralized 210 by the base and reduces the line edge roughness of the feature.

By applying the base-loaded polymer after developing the photoresist, as in the above embodiment, the photoresist sensitivity is not significantly affected, and therefore no significant amount of incident radiation energy need be applied during exposure.

Figure 3:
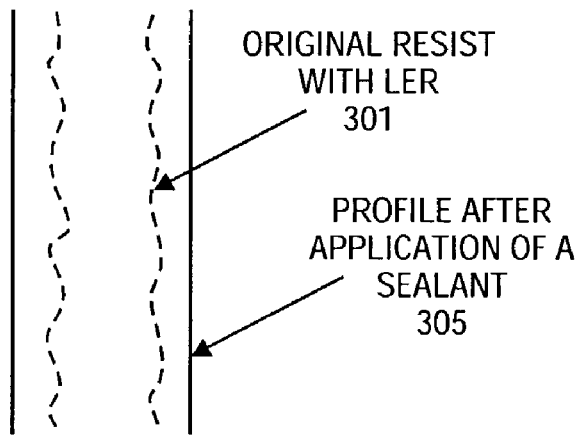
FIG. 3 illustrates a cross-section of line edge roughness according to one embodiment of the invention.

Alternatively, a sealant may be implied instead of a base-loaded polymer in a similar way as described above. The sealant, however, serves to fill in imperfections of the feature line edge rather than neutralize the acid within the line edge in order to reduce line edge roughness. FIG. 3 illustrates one embodiment of the invention in which a sealant is applied. As illustrated in FIG. 3, the original resist line edge roughness 301 is smoothed by application of the sealant 305.

Figure 4:
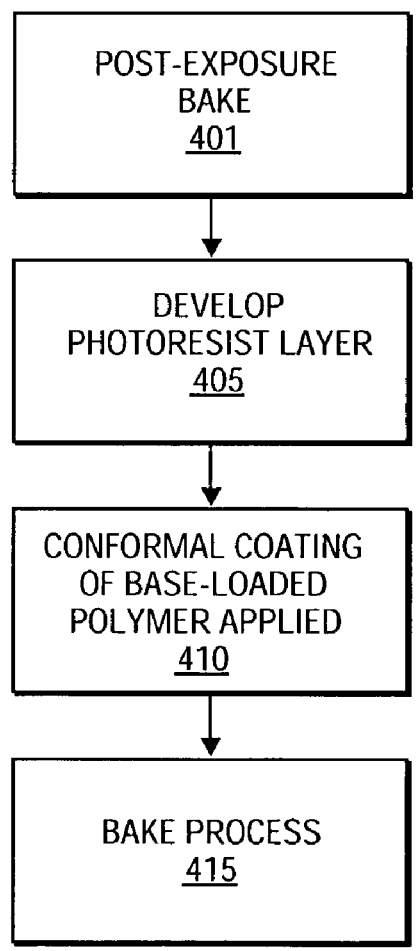
FIG. 4 is a flow diagram illustrating a semiconductor process according to one embodiment of the invention.

FIG. 4 is a flow chart illustrating one embodiment of the invention. First, at operation 401, a post-exposure bake is performed on a semiconductor wafer to partially deprotect the photoresist layer. Next, the photoresist layer is developed at operation 405, and a conformal coating of base-loaded polymer is applied to the wafer at operation 410. At operation 415, a second bake is then performed on the wafer.

Various materials may be used in various embodiments of the invention. In some embodiments of the invention, the polymer may be a sealant, such as aliphatic and/or aromatic oligomer, monomer, and/or macromonomer with epoxide, such as acrylic, styrenic, or vinyl. Oligomer, monomer, and macromonomer can also induce solubility in alkane, alcohol, aqueous, or a fluorocarbon solvent system. Furthermore, polymer blends and/or blends of polymer and composite filler materials may also be used.

Filler materials may be colloidal inorganic or crosslinked organic material, such as silica, alumina, $CaF_2$, colloidal cross-linked polystyrene, fullerines, metal clusters, etc., with a grain size sufficient to "fill in" imperfections of the feature line edge in order to create a smoother line edge. For other embodiments of the invention, the polymer is loaded with a base such as pyridine, piperidineethanol, or amine based quencher such as triethyl, tripropyl, tripentyl, diethanol, or triethanol amine.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. A method comprising:
   depositing a photoresist layer on a semiconductor wafer;
   developing a portion of the photoresist layer to form a feature;
   depositing a base-loaded polymer on the feature after developing the portion of the photoresist layer to reduce line edge roughness of the feature, wherein the base-loaded polymer includes a polymer having a grain size that is less than 5 nm.

2. The method of claim 1 wherein the based-loaded polymer includes a material chosen from a group consisting of: pyridine, piperidineethanol, triethyl, tripropyl, trpentyl, diethanol, and triethanol.

3. The method of claim 2 further comprising a first baking of the photoresist layer to partially deprotect the photoresist.

4. The method of claim 3 further comprising a second baking of the feature.

5. The method of claim 4 wherein during the second baking, residual acid residing at an edge of the feature reacts with the base.

6. The method of claim 5 wherein the residual acid is neutralized by reacting with the base, resulting in a less line edge roughness in the feature than existed prior to the residual acid reacting with the base.

7. The method of claim 6 wherein the amount of base deposited is approximately less than or equal to the amount of residual acid.

8. The method of claim 7 wherein the first baking is shorter than the second bake.

9. An apparatus comprising:
   means for depositing a photoresist layer on a semiconductor wafer;
   means for exposing a portion of the photoresist layer to an incident radiation;
   means for developing the portion to form a feature;
   means for depositing a base-loaded polymer on the feature after developing the portion of the photoresist layer to reduce line edge roughness of the feature, wherein the base-loaded polymer includes a polymer having a grain size that is less than 5 nm.

10. The apparatus of claim 9 wherein the based-loaded polymer includes a material chosen from a group consisting of: pyridine, piperidineethanol, triethyl, tripropyl, trpentyl, diethanol, and triethanol.

11. The apparatus of claim 10 further comprising a means for performing a post-exposure bake of the photoresist layer to partially deprotect the photoresist.

12. The apparatus of claim 11 further comprising a means for performing a final baking of the feature after the post-exposure bake.

13. The apparatus of claim 12 further comprising a means for introducing residual acid residing at an edge of the feature with the base.

14. The apparatus of claim 13 wherein the means for introducing is to facilitate residual acid being neutralized by the base.

15. The apparatus of claim 14 wherein the means for depositing the base-loaded polymer is a thin coat process.

16. The apparatus of claim 15 wherein the means for introducing the residual acid with the base is a thin coat process.

17. A process comprising:
    performing a post-exposure bake on a semiconductor wafer a period of time and a temperature to partially deprotect a photoresist layer portion deposited on the semiconductor wafer;
    developing the photoresist layer portion after performing the post-exposure bake;
    applying a conformal coating of base-loaded polymer on the semiconductor wafer after developing the photoresist portion, wherein the base-loaded polymer includes a polymer having a grain size that is less than 5 nm;
    performing a second bake on the semiconductor wafer after applying the conformal coating.

18. The process of claim 17 wherein, during the second bake, residual acid diffuses toward an edge of a feature formed the developing and reacts with a base within the base-loaded polymer.

19. The process of claim 18 wherein at least same of the residual acid is neutralized by the base.

20. The process of claim 19 wherein a line edge roughness of the feature is reduced by the residual acid reacting the base.

21. The process of claim 20 wherein a sensitivity of the photoresist layer portion is not substantially increased.

22. The process of claim 21 wherein the residual acid is of an approximately lesser or equal concentration than that of the base.

* * * * *